(12) United States Patent
Ogawa et al.

(10) Patent No.: US 7,750,541 B2
(45) Date of Patent: Jul. 6, 2010

(54) PIEZOELECTRIC CERAMIC AND METHOD FOR MAKING THE SAME, AND PIEZOELECTRIC RESONATOR AND METHOD FOR MAKING THE SAME

(75) Inventors: Hirozumi Ogawa, Yasu (JP); Takuya Sawada, Moriyama (JP); Masahiko Kimura, Kusatsu (JP); Kosuke Shiratsuyu, Omihachiman (JP); Akira Ando, Omihachiman (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 12/147,173

(22) Filed: Jun. 26, 2008

(65) Prior Publication Data

US 2008/0284286 A1    Nov. 20, 2008

Related U.S. Application Data

(63) Continuation of application No. PCT/JP2006/319679, filed on Oct. 2, 2006.

(30) Foreign Application Priority Data

Dec. 26, 2005    (JP) .............................. 2005-371773

(51) Int. Cl.
  *H01L 41/187* (2006.01)
(52) U.S. Cl. ...................................... 310/358; 310/346
(58) Field of Classification Search ................. 310/346, 310/358
  See application file for complete search history.

(56) References Cited

U.S. PATENT DOCUMENTS

| 2002/0125796 A1 | 9/2002 | Kimura et al. |
| 2006/0091494 A1* | 5/2006 | Miyamoto et al. .......... 257/532 |
| 2006/0098385 A1 | 5/2006 | Sakashita et al. |

FOREIGN PATENT DOCUMENTS

| EP | 1598872 A1 | 11/2005 |
| JP | 2000-313662 | 11/2000 |
| JP | 2002-047062 | 2/2002 |
| JP | 2003-347151 | 12/2003 |

* cited by examiner

*Primary Examiner*—Thomas M Dougherty
(74) *Attorney, Agent, or Firm*—Dickstein Shapiro LLP

(57) ABSTRACT

A piezoelectric ceramic whose resonance frequency temperature characteristic can be easily adjusted is provided. It contains first and second parts (11 and 12) which can be alternately stacked layers. The first and second parts (11 and 12) are each composed of a compound having a bismuth layer structure, such as a complex oxide containing at least Sr, Bi, and Nb, and have degrees of c-axis orientation different from each other. Since the resonance frequency temperature characteristics change according to the degree of orientation, the first and second parts (11 and 12) having different degrees of orientation are appropriately combined so that the resonance frequency temperature characteristics of the piezoelectric ceramic (2) as a whole is easily adjusted.

16 Claims, 4 Drawing Sheets

PIEZOELECTRIC CERAMIC AND METHOD FOR MAKING THE SAME, AND PIEZOELECTRIC RESONATOR AND METHOD FOR MAKING THE SAME

This is a continuation of application Serial No. PCT/JP2006/319679, filed Oct. 2, 2006.

TECHNICAL FIELD

The present invention relates to piezoelectric ceramics and methods for making the piezoelectric ceramics and piezoelectric resonators and methods for making the piezoelectric resonators. In particular, it relates to a technique for adjusting a resonance frequency temperature characteristic of a piezoelectric ceramic.

BACKGROUND ART

If a piezoelectric device is made by using a piezoelectric ceramic that undergoes only small changes in resonance frequency with temperature, the resulting piezoelectric device will have an advantage that the variations of resonance frequency characteristics with temperature are small. Thus, one of the desirable objectives in the field of piezoelectric devices is to decrease the rate of change of frequency of the piezoelectric ceramic with temperature. In particular, in the case where a piezoelectric ceramic is applied to a resonator, the change in oscillating frequency with temperature is largely dependent on the change in frequency of the piezoelectric ceramic with temperature. Thus, as the change in frequency of the piezoelectric ceramic with temperature becomes small, a higher precision resonator can be obtained.

One of the existing technologies for adjusting the resonance frequency temperature characteristics of piezoelectric ceramics related to the present invention is the technology disclosed in Japanese Unexamined Patent Application Publication No. 2001-39766 (Patent Document 1). Patent Document 1 discloses a piezoelectric resonator that utilizes thickness-shear vibrations and is composed of a piezoelectric ceramic containing a bismuth layer compound ($CaBi_4Ti_4O_{15}$), in which the cut angle relative to the c axis of the piezoelectric ceramic is changed to adjust the rate of change of frequency with temperature.

However, it is necessary for the process to measure the orientation angle of the c axis lot-by-lot depending on the target rate of change of frequency with temperature according to the technology disclosed in Patent Document 1. Thus, the productivity is low. Moreover, a highly difficult process of measuring the angle is essential, which is problematic.

Patent Document 1: Japanese Unexamined Patent Application Publication No. 2001-39766

DISCLOSURE OF INVENTION

Problems to be Solved by the Invention

An object of the present invention is to provide a piezoelectric ceramic having an easily adjustable resonance frequency temperature characteristic and a method for making the piezoelectric ceramic.

Another object of the present invention is to provide a piezoelectric resonator including the piezoelectric ceramic described above and a method for making the piezoelectric resonator.

Means for Solving the Problems

The present invention is based on the inventors' finding that the resonance frequency temperature characteristic of a piezoelectric ceramic having a bismuth layer structure changes depending on the degree of c-axis orientation. At least two parts having degrees of c-axis orientation different from each other are combined so as to adjust the resonance frequency temperature characteristic or achieve a target resonance frequency temperature characteristic.

In particular, a piezoelectric ceramic of the present invention includes at least a first part and a second part having degrees of c-axis orientation which are different from each other and each being composed of a compound having a bismuth layer structure.

Preferably, the first part and the second part are layers and are alternately stacked.

Preferably, the first part has a positive resonance frequency temperature coefficient and the second part has a negative resonance frequency temperature coefficient.

In the piezoelectric ceramic of the present invention, the compound having the bismuth layer structure is preferably a complex oxide containing at least Sr, Bi, and Nb. In such a case, the degree of c-axis orientation of the first part is preferably 70% or more and the degree of c-axis orientation of the second part is preferably less than 70% when the degree of orientation is analyzed by the Lotgering method. This is because the boundary that determines whether the compound having the bismuth layer structure composed of the complex oxide containing at least Sr, Bi, and Nb exhibits a positive or negative resonance frequency temperature coefficient generally lies at a degree of orientation of 70%.

The Lotgering method is one of the methods for measuring the degree of crystal orientation of specimens. In particular, the reflection intensity from each crystal face (hkl) of a non-oriented specimen is defined as I(hkl), and the total intensity is defined as $\Sigma I(hkl)$. Of these, the total of the reflection intensities I(001) from the (001) faces is defined as $\Sigma I(001)$, and the ratio P0 is determined from the following equation:

$$P0 = \{\Sigma I(001)/\Sigma I(hkl)\}$$

The reflection intensities $\Sigma I(hkl)$ and $\Sigma I(001)$ are also determined in the same manner for an oriented specimen and the ratio P is determined from the following equation:

$$P = \{\Sigma I(001)/\Sigma I(hkl)\}$$

degree of orientation F is then determined from P0 and P from the following equation:

$$F = \{(P-P0)/(1-P0)\} \times 100 [\%]$$

The invention is also directed to a piezoelectric resonator including the piezoelectric ceramic and an electrode disposed to be in contact with the piezoelectric ceramic.

The present invention is also directed to a method for making the piezoelectric ceramic. The method for making the piezoelectric ceramic of the present invention includes a step of preparing a first ceramic green sheet including a first content of plate crystal grains having a bismuth layer structure; a step of preparing a second ceramic green sheet including a second content of plate crystal grains having a bismuth layer structure, the second content being lower than the first content (the second content may be zero); a step of preparing a laminate by alternately stacking the first and second ceramic green sheets; and a step of baking the laminate.

The present invention is also directed to a method for making a piezoelectric resonator including a step of obtaining a piezoelectric ceramic by the above-described method for making the piezoelectric ceramic, and a step of forming electrodes so that the electrodes contact the piezoelectric ceramic.

ADVANTAGES

As described above, the present inventors have found that the resonance frequency temperature characteristic of a piezoelectric ceramic having a bismuth layer structure changes depending on the degree of c-axis orientation and made the present invention.

According to the piezoelectric ceramic of the present invention, since the first and second parts having degrees of c-axis orientation which are different from each other and thus have resonance frequency temperature characteristics which are different from each other are provided, the resonance frequency temperature characteristic of the piezoelectric ceramic as a whole equals to the combination of the resonance frequency temperature characteristic of the first part and the resonance frequency temperature characteristic of the second part. Thus, the resonance frequency temperature characteristic of the piezoelectric ceramic as a whole can be easily adjusted by changing the degree of c-axis orientation in one or both of the first and second parts or by changing the volumetric ratio of the first and second parts. Moreover, a target resonance frequency temperature characteristic can be easily achieved in the same manner.

For example, where the first and second parts are layers and are alternately stacked, the resonance frequency temperature characteristic of the piezoelectric ceramic as a whole can be easily adjusted by changing the number of stacked layers of the first and second parts and by changing the thickness of the layers.

It is possible to adjust the rate of change of resonance frequency of the piezoelectric ceramic as a whole with temperature to, for example, zero by adjusting the first part to have a positive resonance frequency temperature coefficient and the second part to have a negative resonance frequency temperature coefficient.

As discussed above, the frequency-temperature characteristic of a piezoelectric ceramic having a bismuth layer structure changes depending on the degree of c-axis orientation. Thus, it is possible to adjust the resonance frequency temperature characteristic by adjusting the degree of orientation only. For example, suppose that the desired resonance frequency temperature characteristic can be achieved by adjusting the degree of orientation to an intermediate level. Then, there is no need to use a combination of the first and second parts as in this invention as long as the piezoelectric ceramic itself is adjusted to have an intermediate degree of orientation from the beginning. However, it is difficult to stably produce piezoelectric ceramics with an intermediate degree of orientation by controlling the degree of orientation. According to the present invention, ceramics having a high degree of orientation (nearly 100%) and ceramics having a low degree of orientation (non-oriented ceramics) which can be produced stably are combined so that the degree of orientation as a whole can be adjusted to an intermediate level. Thus, a piezoelectric ceramic having a desired characteristic can be produced stably.

According to the method for making the piezoelectric ceramic of the present invention, the first and second ceramic green sheets containing different amounts of plate crystal grains having bismuth layer structures from each other are separately prepared and alternately stacked to form a laminate, and the laminate is baked. Thus, in the resulting piezoelectric ceramic, the degree of orientation of the first part derived from the first ceramic green sheet and the degree of orientation of the second part derived from the second ceramic green sheet can be adjusted as desired. Moreover, the number of first and second ceramic green sheets stacked and the thickness of the first and second ceramic green sheets can be changed as desired. Thus, the resonance frequency temperature characteristic of the resulting piezoelectric ceramic as a whole can be easily adjusted to a desired level.

Furthermore, according to the method for making the piezoelectric ceramic of the present invention, the onerous operation of measuring the angle of c-axis orientation before processing described in Patent Document 1 is no longer necessary and a desired piezoelectric ceramic can be fabricated efficiently.

Figure 1:
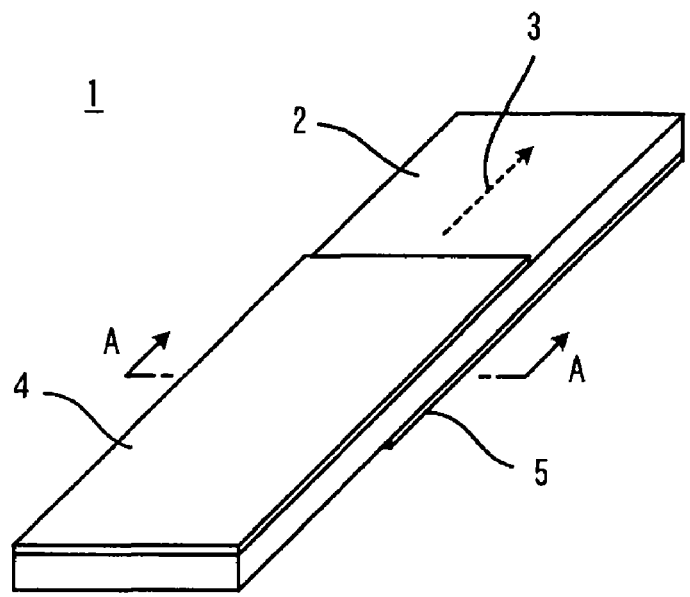
FIG. 1 is a perspective view showing a piezoelectric resonator 1 which utilizes thickness-shear vibrations and is an example of a piezoelectric resonator including a piezoelectric ceramic of the present invention.

REFERENCE NUMERALS 1 piezoelectric resonator
2 piezoelectric ceramic
4,5 electrodes
11 first part
12 second part
21 first ceramic green sheet
22 second ceramic green sheet

BEST MODES FOR CARRYING OUT THE INVENTION

FIG. 1 is a perspective view showing a piezoelectric resonator 1 which utilizes thickness-shear vibrations and is an example of a piezoelectric resonator including a piezoelectric ceramic of the present invention.

The piezoelectric resonator 1 includes a piezoelectric ceramic 2 having a shape of a rectangular parallelepiped or a rectangular plate, for example. The piezoelectric ceramic 2 is polarized so that the polarization direction indicated by a broken arrow 3 is exhibited.

Two main surfaces of the piezoelectric ceramic 2 extending in the polarization direction 3 and opposing each other are respectively provided with an electrode 4 and an electrode 5.

The electrode 4 is formed to extend from one end of the piezoelectric ceramic 2 in the longitudinal direction to an intermediate portion in the longitudinal direction. The electrode 5 is formed to extend from another end of the piezoelectric ceramic 2 in the longitudinal direction to the intermediate portion in the longitudinal direction. The electrodes 4 and 5 face each other across the intermediate portion of the piezoelectric ceramic 2 in the longitudinal direction.

Figure 2:
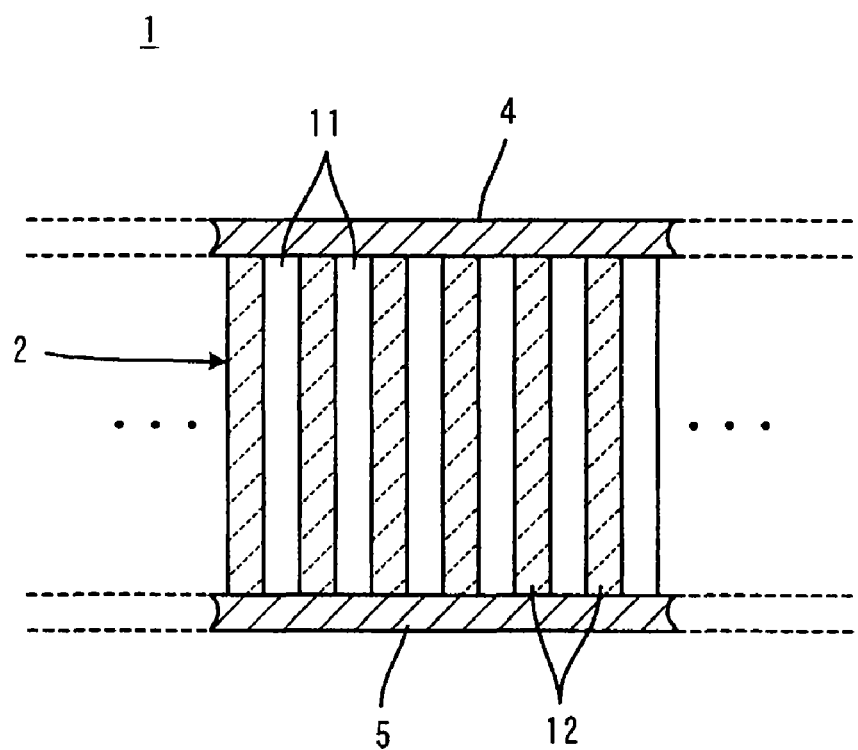
FIG. 2 is an enlarged cross-sectional view taken along line A-A in FIG. 1.

FIG. 2 is an enlarged cross-sectional view taken along line A-A in FIG. 1. In FIG. 2, the components corresponding to the components shown in FIG. 1 are indicated by the same reference symbols.

Referring to FIG. 2, the piezoelectric ceramic 2 has first parts 11 and second parts 12. The first and second parts 11 and 12 are composed of compounds having bismuth layer structures and have degrees of c-axis orientation different from each other. In this embodiment, the first and second parts 11 and 12 are layers and are alternately stacked.

As described above, when the c-axis orientation differs between the first part 11 and the second part 12, the resonance frequency temperature characteristic also differs between the first part 11 and the second part 12. In other words, the resonance frequency temperature characteristics change depending on the degree of c-axis orientation.

Figure 3:
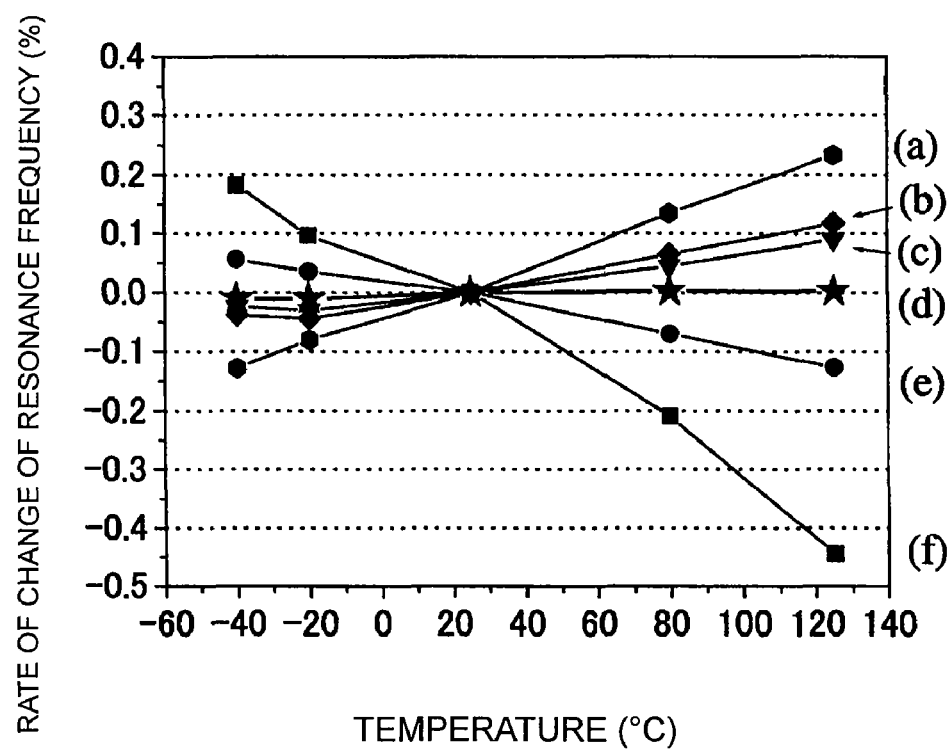
FIG. 3 is a graph showing how the temperature dependence of the change in resonance frequency changes depending on the degree of c-axis orientation a complex oxide at least containing Sr, Bi, and Nb.

FIG. 3 is a graph showing how the temperature dependence of the change in resonance frequency changes depending on the degree of c-axis orientation of the compound having a bismuth structure, the graph being plotted on the basis of data obtained by the present inventors. As the specimens of compounds having bismuth layer structures, specimens composed of complex oxides ($SrBi_2Nb_2O_9$-based materials) at least containing Sr, Bi, and Nb and having Lotgering degrees of orientation of (a) 96%, (b) 90%, (c) 82%, (d) 76%, (e) 54%, and (f) zero, respectively, were prepared, and the resonance frequency of each specimen in a thickness shear mode was measured at temperatures of −40° C., −20° C., 20° C., 80° C., and 125° C. FIG. 3 also shows the rates of change of resonance frequency at the other temperatures determined on the basis of the resonance frequency observed at 20° C.

As shown in FIG. 3, the resonance frequency temperature coefficient changes at different degrees of orientations such as (a) to (f). Moreover, in the case of the bismuth layer compound composed of a complex oxide at least containing Sr, Bi, and Nb, upward sloping temperature characteristics are observed for (a) to (d) having degrees of orientation of 70% or more, and downward sloping temperature characteristics are observed for (e) and (f) having degrees of orientation less than 70%. In other words, where the bismuth layer compounds having the above-described compositions are concerned, the boundary that determines whether the resonance frequency temperature coefficient is positive or negative generally lies at a degree of orientation of 70%. Thus, positive resonance frequency temperature coefficients are obtained from specimens (a) to (d) having degrees of orientation of 70% or more, and negative resonance frequency temperature coefficients are obtained from specimens (e) and (f) having degrees of orientation less than 70%.

Referring again to FIG. 2, when any one of (a) to (d) having a degree of c-axis orientation of 70% or more is used in the first part 11 of the piezoelectric ceramic 2 while using (e) or (f) having a degree of c-axis orientation of less than 70% in the second part 12, the first part 11 exhibits a positive resonance frequency temperature coefficient and the second part 12 exhibits a negative resonance frequency temperature coefficient. Thus, the resonance frequency temperature coefficient can be made close to zero.

The piezoelectric ceramic 2 having the first and the second parts 11 and 12 can be made as follows.

First, plate crystal grains having a bismuth layer structure are made. A templated grain growth method (TGG), a hot forging method, a magnetic field molding method, a reactive templated grain growth (RTGG) method, or the like may be employed in making the plate crystal grains.

A first ceramic green sheet including a first content of the plate crystal grains having the above-described bismuth layer structure is prepared, and a second ceramic green sheet including a second content of the plate crystal grains having the above-described bismuth layer structure is prepared, the second content being lower than the first content (the second content may be zero).

The first and second ceramic green sheets are alternately stacked to form a laminate. The ratio of the numbers of the first and second ceramic green sheets to be stacked and/or the thickness of each of the first and second ceramic green sheets may be changed so as to change the volumetric ratio of the first and second ceramic green sheets.

The laminate is then baked. As a result, a sinter that forms the piezoelectric ceramic 2 is obtained. The sinter has the first part 11 derived from the first ceramic green sheet and the second part 12 derived from the second ceramic green sheet. The sinter is then subjected to polarization treatment and cut, if necessary, to form the piezoelectric ceramic 2 for the piezoelectric resonator 1.

The electrodes 4 and 5 are formed on the piezoelectric ceramic 2 to obtain the piezoelectric resonator 1.

In this embodiment, as shown in FIG. 2, the stacking direction of the first part 11 and the second part 12 in the piezoelectric ceramic 2 is the direction in which shorter sides of the piezoelectric ceramic 2 extend. Alternatively, the stacking direction may be the direction in which longer sides of the piezoelectric ceramic 2 extend or may be diagonal with respect to the direction in which a particular side extends.

The piezoelectric resonator to which the piezoelectric ceramic of the present invention is applied is not limited to the piezoelectric resonator 1 that utilizes the thickness-shear vibrations, and may be a piezoelectric resonator that utilizes a different vibration mode or has a different structure.

Experimental examples conducted to confirm the effects of the present invention will now be described.

Powders of $SrCO_3$, $Nd_2O_3$, $Bi_2O_3$, and $Nb_2O_5$ were weighed to obtain a composition represented by $Sr_{0.9}Nd_{0.1}Bi_2Nb_2O_9$, $MnCO_3$ serving as a sinter aid was added thereto so that the content was 1 mol %, and the resulting mixture was ball-milled with zirconia balls and water. The resulting mixture was dehydrated and dried, and then calcined at a temperature of 800° C. to 1000° C. to obtain a calcined material.

Plate crystal grains were made from the calcined material by employing the TGG method described below. First, the calcined material, NaCl, and KCl were mixed at a volume ratio of 2:1:1 in a mortar. The resulting mixture powder was placed in an alumina crucible and covered with an alumina lid to conduct heat treatment at a temperature of 1100° C. to 1200° C. The amount of the mixture powder in the crucible was adjusted to fill about half the volume of the crucible. After cooling, the mixture of the calcined material, NaCl, and KCl was discharged from the crucible and stirred in pure water so as to dissolve the NaCl and KCl in pure water to thereby remove NaCl and KCl. The remaining ceramic powder was dehydrated and dried to obtain plate crystal grains.

The plate crystal grains obtained as above, the calcined material, a binder, a dispersant, and water were mixed with zirconia balls to obtain a first slurry. The calcined material, a binder, a dispersant, and water were mixed with zirconia balls to obtain a second slurry. The first and second slurries were respectively formed into a first and second ceramic green sheets 40 μm in thickness by the doctor blade method.

The process of stacking the first and second ceramic green sheets was conducted as below to form Samples 1 to 4 having different multilayer structures.

Figure 4:
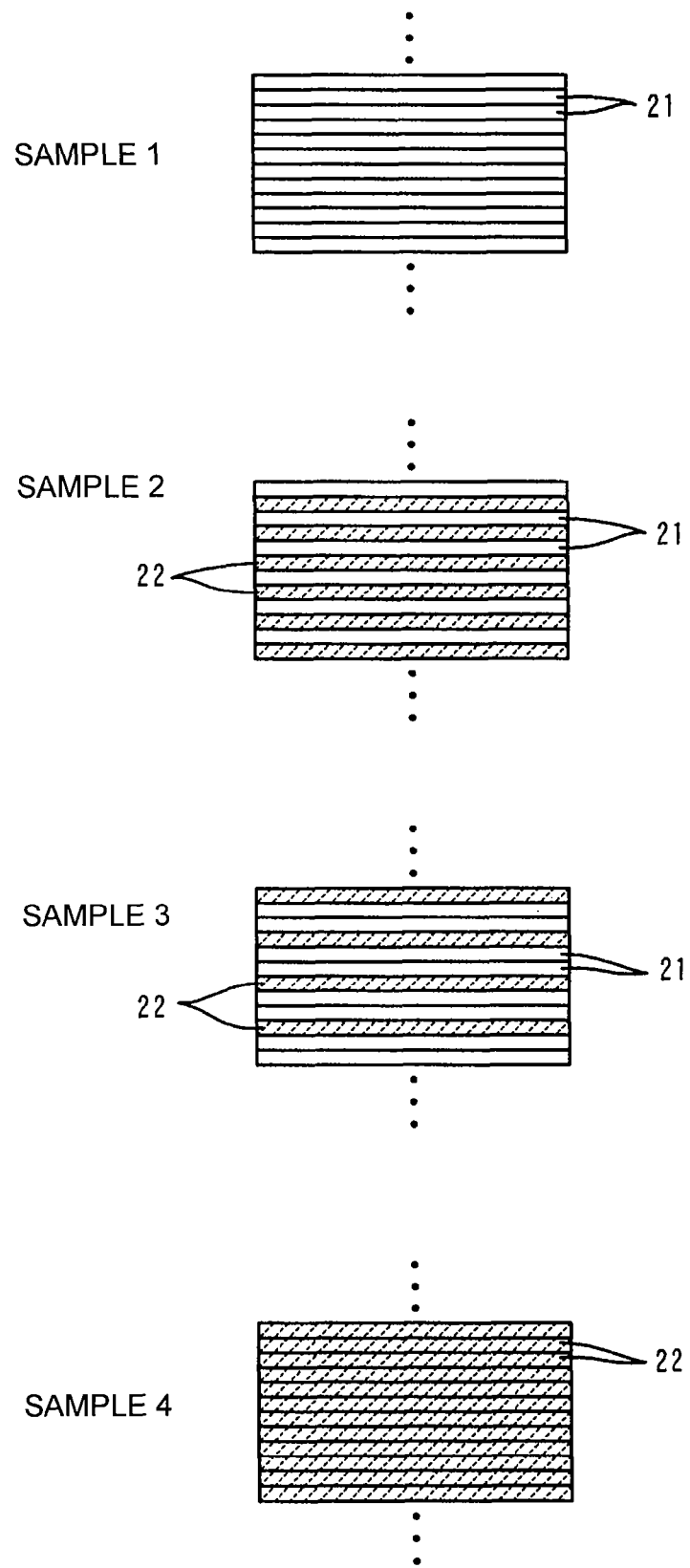
FIG. 4 includes cross-sectional views showing the stacking state of first and second ceramic green sheets 21 and 22 of Samples 1 to 4 prepared in the Experimental Example.

Sample 1, as shown in FIG. 4, was a laminate formed by stacking first ceramic green sheets 21 only. Sample 2 was a laminate formed by alternately stacking the first ceramic green sheets 21 and second ceramic green sheets 22 one by one. Sample 3 was a laminate formed by alternately stacking two first ceramic green sheets 21 and one second ceramic green sheet 22. Sample 4 was a laminate formed by stacking the second ceramic green sheets 22 only.

Each of the laminates of Samples 1 to 4 obtained as above was degreased at a temperature of 500° C. and baked in a sealed sagger in the temperature range of 1100° C. to 1300° C. to obtain sinters of Samples 1 to 4.

The degree of c-axis orientation was determined by a Lotgering method from an X-ray diffraction pattern of the surface of each sinter. Sample 1 had a 95% orientation while Sample 4 had no orientation.

Each of the sinters of Samples 1 to 4 was cut in a direction parallel to the sheet stacking direction into a 4 mm width, silver electrodes were formed on the cut surfaces by sputtering, and a polarization treatment was conducted in silicone oil at a temperature of 150° C. to 200° C. while applying a electrical field intensity of 4 to 10 kV/mm for 10 minutes. The sinter of each sample was processed with a dicing saw so that the sides parallel to the sheet stacking direction were 0.6 mm in length, the sides in the polarization direction were 4 mm in length, and other sides were 0.3 mm in length. Subsequently, silver electrodes were formed on 0.6 mm×4 mm surfaces by sputtering to thereby obtain a resonator sample for measuring the thickness-shear vibrations.

The resonator sample was placed in a temperature chamber, and the change in resonance waveforms with temperature was measured with an impedance analyzer in a temperature range of –40° C. to +125° C. to obtain the rate of change of resonance frequency with temperature. The rate of change of resonance frequency with temperature was determined by the equation:

$$\{(fr_{125}-fr_{-40})/(fr_{20}\times 165)\}\times 10^6 \text{ [ppm/° C.]}$$

where $fr_{125}$, $fr_{-40}$, and $fr_{20}$ respectively represent resonance frequencies at 125° C., –40° C., and 20° C.

As a result, the rate of change of resonance frequency with temperature was +22 ppm/° C. for Sample 1 and –50 ppm/° C. for Sample 4. The rate was –10 ppm/° C. for Sample 2 and 0.5 ppm/° C. for Sample 3. Since Samples 2 and 3 were combinations of Samples 1 and 4, Samples 2 and 3 exhibited intermediate values.

Figure 5:
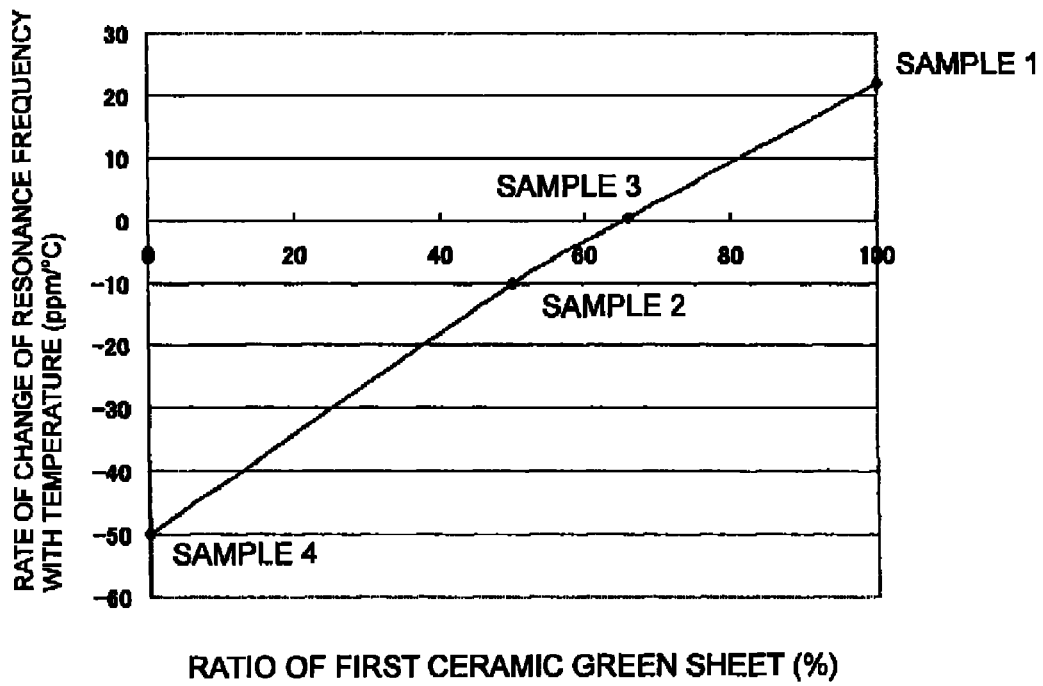
FIG. 5 shows the rate of change of resonance frequency with temperature of each of Samples 1 to 4 prepared in the Experimental Example.

FIG. 5 shows the rate of change of resonance frequency with temperature of each of Samples 1 to 4 having different first green sheet ratios. FIG. 5 shows that as the ratio of the first green sheets increases, the rate of change of resonance frequency with temperature shifts from negative to positive and becomes higher.

Figure 6:
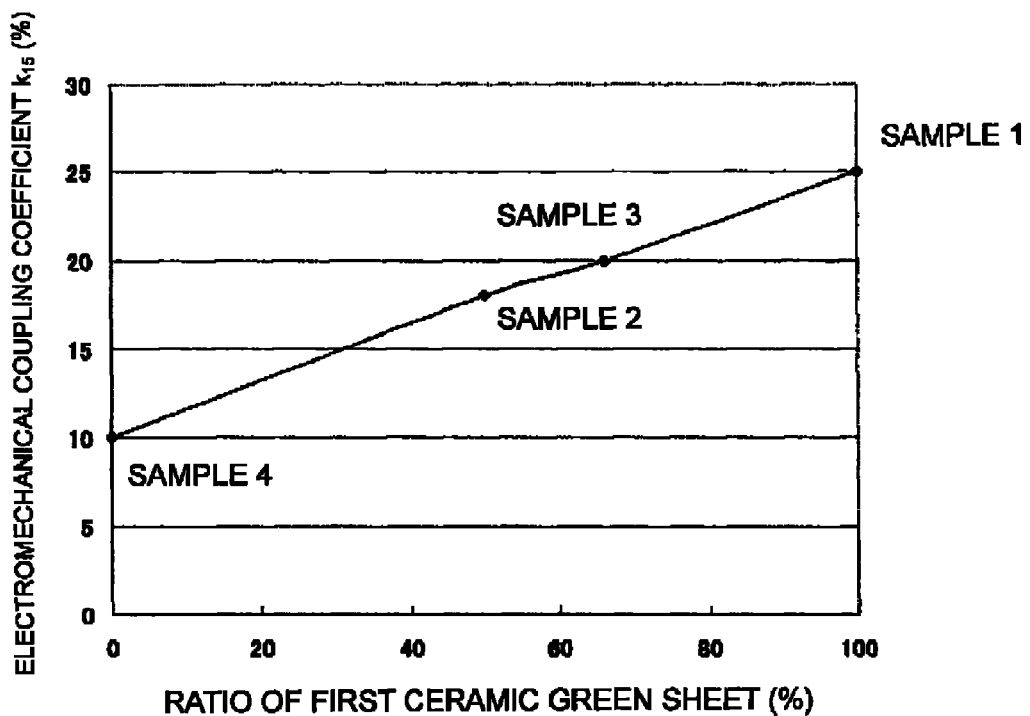
FIG. 6 shows electromechanical coefficients $k_{15}$ of Samples 1 to 4 prepared in the Experimental Example.

Note that it is known that characteristics other than the resonance frequency temperature characteristic, e.g., the electromechanical coefficient $k_{15}$, also change depending on the degree of c-axis orientation. FIG. 6 shows the electromechanical coefficients $k_{15}$ of Samples 1 to 4 prepared in this experimental example. As discussed above, when Samples 1 to 4 having different first green sheet ratios are compared, the electromechanical coefficients $k_{15}$ increases as the ratio of the first green sheet increases.

Although the present invention is described by way of embodiments illustrated in the drawings, various modifications and alterations are possible without departing from the scope of the present invention.

For example, although in the embodiment described above the piezoelectric ceramic 2 has the first part 11 and the second part 12, the piezoelectric ceramic 2 may further include a third portion having a different degree of c-axis orientation from those of the first and second parts 11 and 12 in addition to the first and second parts 11 and 12. Naturally, the piezoelectric ceramic 2 may include four or more types of portions.

The invention claimed is:

1. A piezoelectric ceramic comprising a first part and a second part each composed of a compound having a bismuth layer structure, wherein the first part has a degree of c-axis orientation which is different from that of the second part, and wherein the first part has a positive resonance frequency temperature coefficient and the second part has a negative resonance frequency temperature coefficient.

2. The piezoelectric ceramic according to claim 1, wherein the first and second parts are layers and are alternately stacked.

3. The piezoelectric ceramic according to claim 1, wherein the compound having the bismuth layer structure is a complex oxide containing at least Sr, Bi, and Nb.

4. A piezoelectric resonator comprising the piezoelectric ceramic according to claim 2 and an electrode in contact with the piezoelectric ceramic.

5. A piezoelectric ceramic comprising a first part and a second part each composed of a compound having a bismuth layer structure,
   wherein the first part has a degree of c-axis orientation which is different from that of the second part,
   wherein the compound having the bismuth layer structure is a complex oxide containing at least Sr, Bi, and Nb, and
   wherein the first part has a degree of c-axis orientation of 70% or more and the second part has a degree of c-axis orientation of less than 70% measured by the Lotgering method.

6. The piezoelectric ceramic according to claim 5, wherein the first and second parts are layers and are alternately stacked.

7. The piezoelectric ceramic according to claim 6, wherein at least one of the first and second parts comprises a plurality of layers.

8. The piezoelectric ceramic according to claim 7, wherein the second part has a 0 degree of c-axis orientation by the Lotgering method.

9. A piezoelectric resonator comprising the piezoelectric ceramic according to claim 8 and an electrode in contact with the piezoelectric ceramic.

10. A piezoelectric resonator comprising the piezoelectric ceramic according to claim 7 and an electrode in contact with the piezoelectric ceramic.

11. A piezoelectric resonator comprising the piezoelectric ceramic according to claim 6 and an electrode in contact with the piezoelectric ceramic.

12. A piezoelectric resonator comprising the piezoelectric ceramic according to claim 5 and an electrode in contact with the piezoelectric ceramic.

13. A piezoelectric resonator comprising the piezoelectric ceramic according to claim 4 and an electrode in contact with the piezoelectric ceramic.

14. A piezoelectric resonator comprising the piezoelectric ceramic according to claim 1 and an electrode in contact with the piezoelectric ceramic.

15. A method for making a piezoelectric resonator, comprising: providing a piezoelectric ceramic according to claim 1; and forming at least one electrode in contact the piezoelectric ceramic.

16. A method for making a piezoelectric resonator, comprising: providing a piezoelectric ceramic according to claim 6; and forming at least one electrode in contact the piezoelectric ceramic.

\* \* \* \* \*